(12) United States Patent
Silva-Martinez et al.

(10) Patent No.: US 10,938,352 B1
(45) Date of Patent: Mar. 2, 2021

(54) METHODS AND APPARATUS FOR ONLINE TIMING MISMATCH CALIBRATION FOR POLAR AND SEGMENTED POWER AMPLIFIERS

(71) Applicant: Vidatronic, Inc., College Station, TX (US)

(72) Inventors: Jose Silva-Martinez, College Station, TX (US); Junning Jiang, College Station, TX (US); He Hu, College Station, TX (US); John Tabler, College Station, TX (US)

(73) Assignee: Vidatronic, Inc., College Station, TX (US)

( * ) Notice: Subject to any disclaimer, the term of this patent is extended or adjusted under 35 U.S.C. 154(b) by 65 days.

(21) Appl. No.: 16/551,670

(22) Filed: Aug. 26, 2019

Related U.S. Application Data

(60) Provisional application No. 62/722,817, filed on Aug. 24, 2018.

(51) Int. Cl.
| | |
|---|---|
| H03F 1/26 | (2006.01) |
| H03F 3/21 | (2006.01) |
| H03M 1/12 | (2006.01) |
| G01R 31/40 | (2020.01) |
| H04B 1/40 | (2015.01) |
| H03K 5/00 | (2006.01) |
| H03K 5/24 | (2006.01) |

(52) U.S. Cl.
CPC ............ *H03F 1/26* (2013.01); *G01R 31/40* (2013.01); *H03F 3/211* (2013.01); *H03M 1/12* (2013.01); *H03F 2200/294* (2013.01); *H03F 2200/387* (2013.01); *H03F 2200/451* (2013.01); *H03F 2203/21139* (2013.01); *H03K 5/2481* (2013.01); *H03K 2005/00019* (2013.01); *H04B 1/40* (2013.01)

(58) Field of Classification Search
CPC ..................................................... H03F 1/26
See application file for complete search history.

(56) References Cited

U.S. PATENT DOCUMENTS

| | | | | |
|---|---|---|---|---|
| 9,794,006 | B2* | 10/2017 | Carlsson | H03F 3/245 |
| 2002/0051546 | A1* | 5/2002 | Bizjak | H03G 7/06 |
| | | | | 381/106 |
| 2007/0189417 | A1* | 8/2007 | Waheed | H04L 7/005 |
| | | | | 375/300 |
| 2008/0116872 | A1* | 5/2008 | Nakazono | H02M 1/32 |
| | | | | 323/284 |

(Continued)

*Primary Examiner* — Patricia T Nguyen
(74) *Attorney, Agent, or Firm* — Liang Legal Group, PLLC

(57) ABSTRACT

An apparatus and methods for timing mismatch in a power amplifier includes a segmented PA with two-path timing mismatch calibration to improve ACLR performance over different signal transitions, process, voltage and temperature (PVT) variations and device aging; a fast and efficient algorithm for measuring and calibrating the delay of two paths (signal path and control path); a signal magnitude variation detection circuit, such as flash ADC, with improved comparator's performance for RF signal processing and minimum delay. A method for choosing the threshold voltage of the magnitude variation detection circuit, according to status of the signals and orthogonal frequency-division multiplexing (OFDM) related standards; other critical blocks.

7 Claims, 11 Drawing Sheets

(56) References Cited

U.S. PATENT DOCUMENTS

| | | | |
|---|---|---|---|
| 2009/0256630 A1* | 10/2009 | Brobston | H03F 1/3247 330/2 |
| 2014/0376676 A1* | 12/2014 | Schafferer | H03F 3/24 375/356 |
| 2017/0353161 A1* | 12/2017 | Loeffler | H03F 1/0222 |
| 2018/0145700 A1* | 5/2018 | Yu | H03F 3/245 |

* cited by examiner

US 10,938,352 B1

METHODS AND APPARATUS FOR ONLINE TIMING MISMATCH CALIBRATION FOR POLAR AND SEGMENTED POWER AMPLIFIERS

CROSS REFERENCE TO RELATED APPLICATIONS

This claims the benefits of Provisional Application No. 62/722,817, filed on Aug. 24, 2018, the disclosure of which is incorporated by reference in its entirety.

STATEMENT REGARDING FEDERALLY SPONSORED RESEARCH OR DEVELOPMENT

This invention was made with government support under Federal Agency Identification Number (FAIN) 1747138 awarded by the National Science Foundation. The government has certain rights in the invention.

FIELD OF INVENTION

This invention relates to apparatus and methods for voltage and power amplifiers, particularly to circuitry for measuring and calibrating the timing alignment characteristics of the signal path and control paths of polar and segmented power amplifiers. The objective is to reduce the power amplifier's signal leakage between adjacent channels and make the Adjacent Channel Leakage Ratio (ACLR) meet desired transmission standards.

BACKGROUND OF THE INVENTION (PRIOR ART)

Demands on portable or wearable electronic devices, such as smartphones, Bluetooth headsets, and so on, are growing quickly in recent years. As the Internet of Things (IoT) network develops rapidly in the past decade, there is a huge demand for low cost radio frequency identification (RFID) with integrated sensors, detectors, and low power transceivers. For low power transmitters, high efficiency of wireless signal transmission plays a central role in saving power and extending battery life. In order to transmit a medium level of power (<30 dBm) and meet the high efficiency requirement, more efficient complementary metal-oxide-semiconductor (CMOS) radio frequency (RF) power amplifiers (PA) have been developed and investigated. Linear architectures with segmented power management, polar and out-phasing architectures, Chireix amplifiers, and other topologies, split the information into two paths to make more efficient power handling within the PA [1][2]. Similar effects arise in the case of PAs that employ envelope-tracking techniques used to improve power efficiencies of various PA architectures. Although all the aforementioned architectures save power, they suffer from a major drawback, which is the timing mismatch between the signal and envelope-tracking paths. Timing mismatch results in increased ACLR, which drastically limits the performance of the intended solution. Thus, it is imperative to minimize this effect. In [3] it is demonstrated that timing offsets must be limited to less than 500 psec to obtain required ACLR under −40 dB and to make the solution compliant with several wireless standards.

In dual path PA configurations (e.g., segmented, polar, out-phasing, Chireix), the timing mismatch between the RF signal path and the PA segments' control path significantly influences the PA's performance, especially with respect to the ACLR. Among previous PA products, one-time factory trimming, or offline calibration is usually conducted. Several types of one-time offline calibration methods [4]-[6] were developed. However, beyond the factory calibration process, the timing mismatch is signal-dependent and will vary drastically with wideband signal of fast-changing transitions. Moreover, the timing mismatch is sensitive to process-voltage-temperature (PVT) variations and device aging. Chip temperature may change by more than 20 degrees when the PA is activated, and on-chip time constants (RC products), which dictates signal delay on different paths, may change by more than 30%. Thus, an online timing-mismatch calibration process is necessary.

Timing misalignment between the magnitude and phase paths in polar PAs leads to stronger spectrum leakage and increasing ACLR. In [7][8], methods based on calculating the correlation between the PA's input and output signals to compensate for this timing mismatch are developed. In [9][10], timing mismatch is calibrated by measuring the output power and ACLR, respectively. Signal polarity is used to improve the ACLR performance in [11].

The above-mentioned methods can dynamically reduce the timing mismatch between different paths, but they still exhibit certain limitations: (1) precise measurement of the PA's output power or ACLR requires other complicated resources, such as down conversion, a broadband analog-to-digital (ADC), and accurate bandpass filtering; (2) mathematical calculations, such as correlating between the magnitude or phase of two RF signals, consumes a large active silicon area and will negatively impact power consumption headroom; and (3) if several iterations for signal evaluation and compensation adjustments are required, this will lower the efficiency of these calibration schemes and restrain their applications in wideband and fast envelope varying scenarios. Therefore, there is still a need for more efficient, faster, and accurate timing mismatch calibration methods on linear segmented PAs used in wideband applications.

SUMMARY OF THE INVENTION

Described herein is a technology relating to an efficient and accurate timing calibration in multi-path power amplifiers (PAs). Exemplary architectures that can use this technology include the Polar, segmented, and out-phasing architectures. In accordance with embodiments of this invention, the timings of two signals, when mixed at the PA, are measured using an agile signal detector. A delay measuring element determines the phase mismatch and generates a control signal that is used to tune a programmable delay element to synchronize the two signal paths. An algorithm, which detects sudden changes in the signal amplitude, and thus the number of PA cells to be active, is used to determine when the delay calibration should be performed again.

One aspect of the invention relates to apparatus for calibrating timing mismatch in a power amplifier. An apparatus in accordance with one embodiment of the invention comprises a segmented power amplifier (PA); a digital signal processor (DSP); and a delay controller connected to the digital signal processor (DSP) and configured to be driven by the digital signal processor (DSP) through an Enable signal, wherein the digital signal processor (DSP) is configured to measure and calibrate a delay between a signal path and a control path, wherein the digital signal processor (DSP) comprises: a signal processing encoder configured to process an input signal to produce a baseband signal ($S_{BB}$) and a magnitude signal ($S_{mag}$); a PA magnitude control connected to the signal processing encoder, wherein the PA magnitude control is configured to use the magnitude signal ($S_{mag}$) to generate a PA reference signal ($S_{PA\_Ref}$), and wherein the PA magnitude control is configured to generate the Enable signal to the delay controller when variation in magnitudes of the input signal exceeds a threshold voltage; a signal conditioning circuit connected to the signal processing encoder and the PA magnitude control, wherein the signal conditioning circuit is configured to condition the baseband signal ($S_{BB}$), based on the PA reference signal ($S_{PA\_Ref}$), to produce a pre-distorted baseband signal ($S_{BB\_PD}$); a programmable delay element connected to the PA magnitude control; and a delay tuning circuit connected to the programmable delay element for controlling the programmable delay element to generate a PA retiming signal ($S_{PA\_Retimed}$).

In accordance with some embodiments, the delay controller comprises a waveform detector and a delay counter. The waveform detector comprises a voltage buffer, an RF ADC, an inverter, and a transient detector. The waveform detector comprises a voltage buffer, a radiofrequency analog-to-digital converter (RF ADC), an inverter, and a transient detector. The RF ADC comprises a flash ADC that comprises a voltage ladder and a set of comparators. The transient detector is a D Flip-Flop base transient detector.

One aspect of the invention relates to methods for calibrating timing mismatch in a power amplifier using any apparatus described above. A method in accordance with one embodiment of the invention comprises: processing, using the signal processing encoder, the input signal to produce the baseband signal ($S_{BB}$) and the magnitude signal ($S_{mag}$); producing the PA reference signal ($S_{PA\_Ref}$) by the PA magnitude control; choosing the threshold voltage for the variation in the magnitudes of the input signal; generating the Enable signal to the delay controller when the variation in the magnitudes of the input signal exceeds the threshold voltage; generating a delay tuning signal from the delay controller to the programmable delay element; and generating the PA retiming signal ($S_{PA\_Retimed}$) by the programmable delay element to minimize time mismatch between the signal path and the control path.

Other aspect of the invention would become apparent with the following detailed description and the associated drawings.

An exemplary embodiment of the invention, a complete power amplifier 100, is illustrated in FIG. 1. The example schematic in FIG. 1 shows the case of a segmented amplifier driven by switchable drivers. The magnitude variations are detected in the PA magnitude block 114 and the enable signal (Enable, input to the Delay Controller 106) indicates the delay detection used in the timing calibration.

The DSP 101 contains five blocks: signal processing encoder 112, signal conditioning circuit 113, PA magnitude control 114, delay tuning 115, and programmable delay element 116. For the signal path, the baseband signal goes through the signal processing encoder 112 and signal conditioning block 113 and then comes to the digital-to-analog converter (DAC) 117. The signal is next up-converted in the RF modulator 118, which is driven by a frequency synthesizer 119. The RF signal is next amplified efficiently through the low-noise amplifier (LNA) 102, programmable gain amplifier (PGA) 103, switchable driver 104, and segmented power amplifier 105. Before injection into the antenna, an impedance matching network 125 adjusts the impedance between the output of the segmented power amplifier 105 and the antenna 128.

The control path includes a delay controller 106, which is driven by the DSP 101 through the enable signal. The delay detection measures the timing delay of the signal path comprised of the DAC 117, frequency modulator 118, LNA 102, and PGA 103 in an online detection fashion, which varies with the signal strength and PVT variations. For the segmented power amplifier's optimum ACLR performance, the delay for the signal path from 101 to 103 through signal processing encoder 112, signal conditioning 113, DAC 117, frequency modulator 118, LNA 102, PGA 103, and the control path from DSP 101 to PGA 103 through PA Magnitude Control 114, Programmable Delay Element 116 should be maintained as small as possible. The blocks 112, 113, 114 and 116 are inside the DSP 101 and are digitally controlled. The programmable delay element 116 is dynamically tuned using the delay tuning information from 106 to adjust itself and balance the delays between the signal path and the control path.

Beyond the PA 100, an off-chip coupler 126 feeds back part of the power amplifiers' output power. The feedback portion goes through an RF down-converter 127, which has an RF modulator 131 and an ADC 132. The output of ADC 132 is sent to make DSP 101 aware of the system output power.

DETAILED DESCRIPTION

Embodiments of the invention relate to apparatus and methods for efficient and accurate timing calibrations in multi-path power amplifiers (PAs). The timing calibration schemes of the invention can be applied to any multi-path power amplifiers, such as polar power amplifiers (PA) and linear segmented RF power amplifiers. FIG. 2 shows a simplified block diagram of a direct converter transmitter 100 that can be calibrated with methods of the invention, and FIG. 1 shows another diagram of this transmitter with the components in the digital signal processor illustrated.

Figure 1:
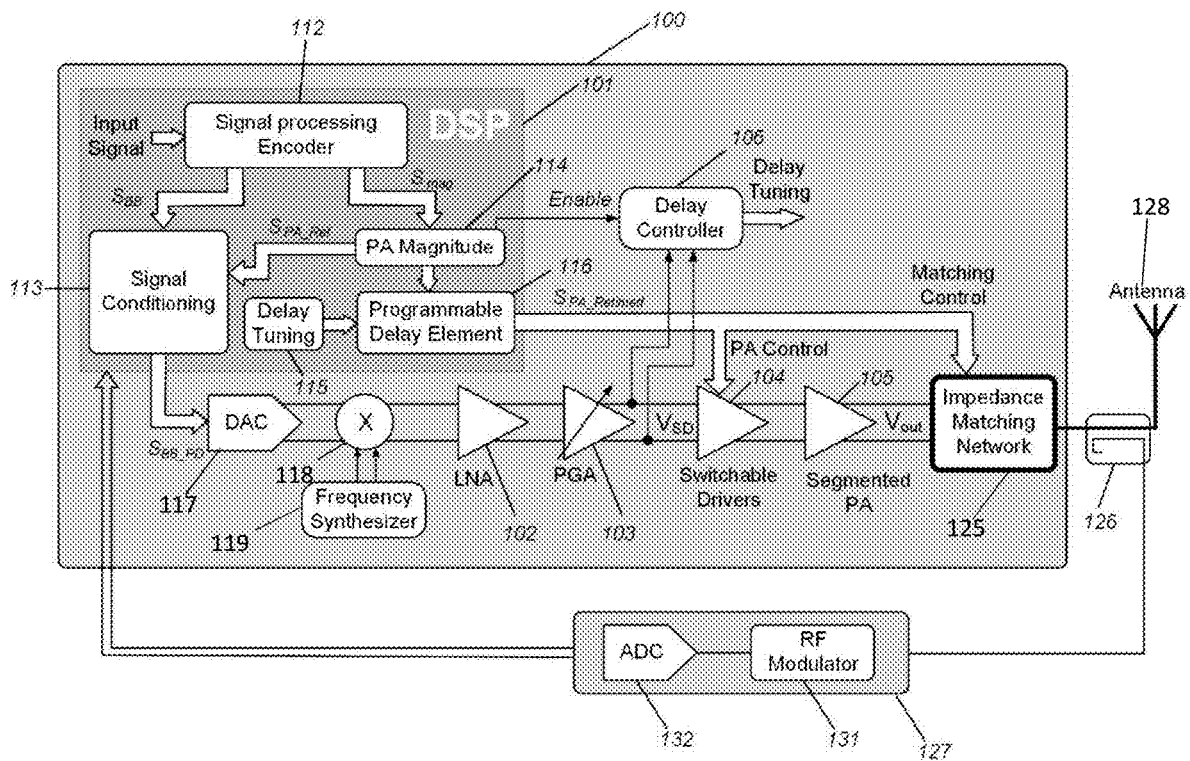
FIG. 1 shows system level blocks illustrating an example of a complete power amplifier (PA) with delay detection and digital signal processor (DSP) in accordance with embodiments of the invention.
Figure 2:
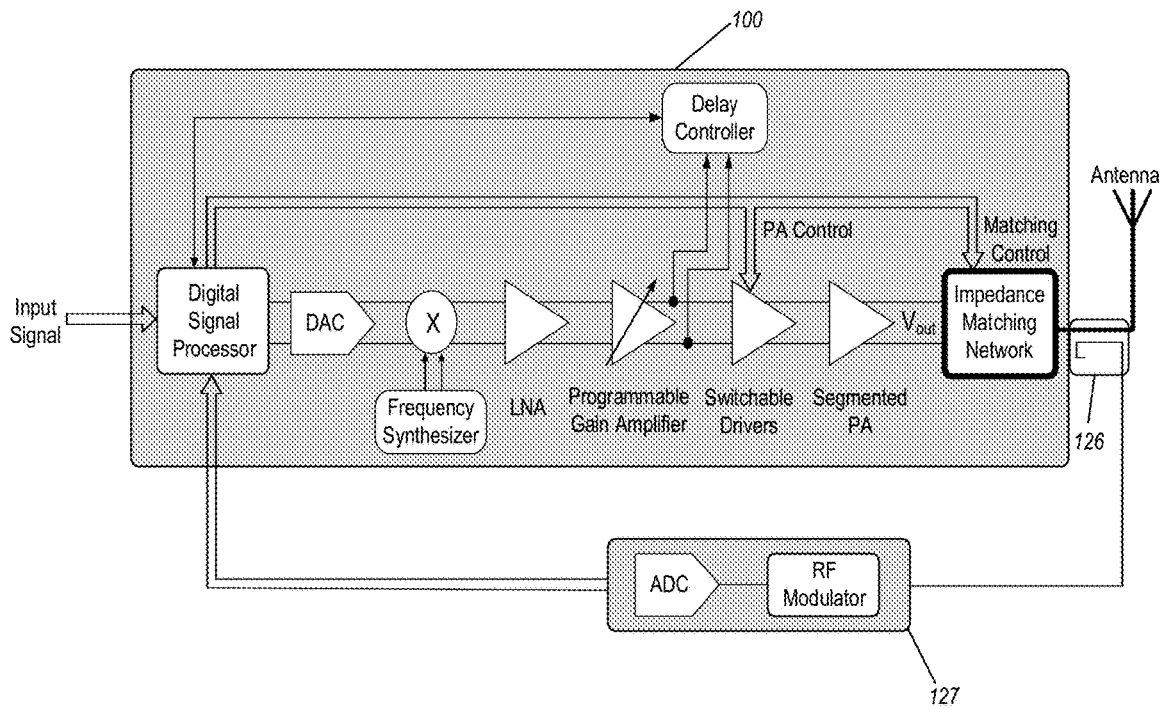
FIG. 2 shows a simplified system level diagram corresponding to the detailed System from FIG. 1.

FIG. 1 shows a top-level architecture of a digitally assisted reconfigurable linear segmented PA 100 with an innovative timing mismatch calibration in accordance with one embodiment of the invention. The configuration of the PA sections is digitally controlled depending on the magnitude of the input signal, i.e., if more power is needed to deliver to the antenna, more segments in the segmented PA 105 may be turned on by the switchable driver 104. The signal conditioning block 113 will always know how many segments in the segmented PA 105 have been activated through $S_{PA\_REF}$, and it tunes the digital gain of $S_{BB}$ to generate $S_{BB\_PD}$.

The power consumption of the PA is correlated with the power delivered to the antenna. Without calibration, there may be a timing mismatch between the PA section control path (signal processing encoder 112, PA magnitude block 114, programmable delay element 116) and the RF signal path (signal processing encoder 112, signal conditioning block 113, DAC 117, frequency modulator 118, LNA 102, PGA 103). In accordance with embodiments of the invention, novel building blocks are developed to form a novel and efficient timing mismatch calibration architecture. The key blocks in this calibration architecture include a delay controller 106 and a programmable delay element 116.

The programmable delay element 116 may be realized digitally inside the DSP 101. The delay is matched to the one experienced by the signal applied to the switchable drivers $V_{SD}$ such that the PA section's control signal is aligned with the input RF signal. The delay controller 106 tunes the programmable delay element 116 through a delay tuning signal 115, which is an output of the delay controller 106. The architecture works as follows: the PA magnitude block 114 manages the magnitude variations of the input signals and generates the PA segmentation control signals for signal pre-warping, and the PA magnitude block 114 also synchronizes the signals using the signal conditioning block 113 such that $S_{PA\_REF}$ is time aligned with the pre-distorted $S_{BB\_PD}$ signal.

This pre-distorted signal $S_{BB\_PD}$ travels through the DAC 117, the frequency modulator 118, low noise amplifier (LNA) 102, and programmable gain amplifier (PGA) 103, and finally reaches the input ($V_{SD}$) of the switchable drivers 104. It is necessary that the PA control signals be aligned with the $V_{SD}$ signal to reconstruct the original signals and hence reduce the spectral leakage into adjacent channels. Through calculation and tests, to satisfy the standards that demand adjacent channel leakage ratio (ACLR) to be below −40 dB, it is necessary to keep the timing mismatch below 500 μsec.

The PA magnitude block 114 also generates the Enable signal, which enables the calibration when a large enough variation occurs on the input signal (e.g., exceeding a threshold). This type of large signal variation facilitates the design of the timing calibration system and increases its robustness. When the delay controller 106 is enabled by the Enable signal, it measures the time delay experienced by $S_{BB\_PD}$ signal at the input ($V_{SD}$) of the switchable drivers 104. A high accuracy reference clock and a digital control loop may be used for this purpose. Once this delay is estimated, the programmable delay element 116 is adjusted to match the measured delay and generates $S_{PA\_retimed}$.

Figure 3:
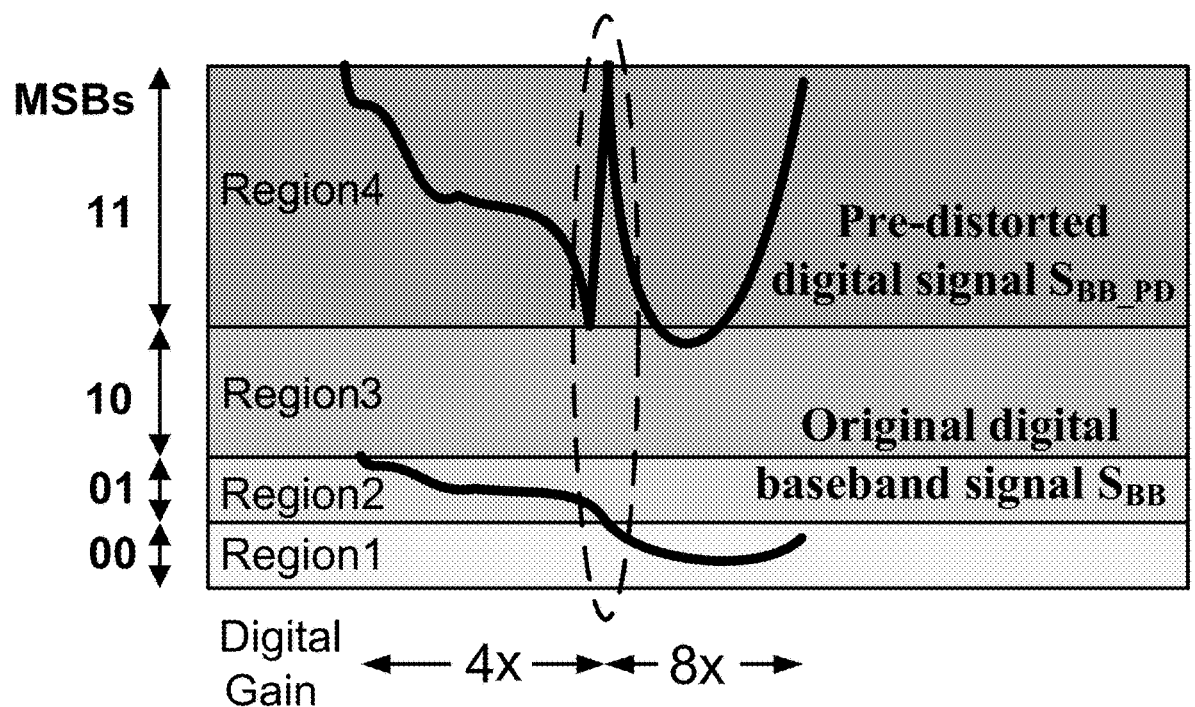
FIG. 3 shows a 4-Level baseband signal conditioning by DSP. Signal conditions for enabling the calibration engine; the pre-distorted signal is measured at the input of the switchable driver.

In accordance with embodiments of the invention, a design of the delay controller 106 may be as follows:

The appropriate time to enable the calibration algorithm is when the input signal amplitude crosses from region N to region N−1 (signal amplitude reduces), as illustrated in FIG. 3. In this case, the pre-warped (pre-distorted) signal, $S_{BB\_PD}$, experiences a large low-to-high voltage variation due to increased digital gain of baseband signal, $S_{BB}$. FIG. 3 shows the change of $S_{BB\_PD}$ due to $S_{BB}$ changing from region 2 to region 1, which leads to a sharp transition of $S_{BB\_PD}$.

When the baseband signal $S_{BB}$ crosses the boundary between region 2 and region 1, the digital gain suddenly changes from 4 to 8; hence, a large positive step variation in $S_{BB\_PD}$ appears. The signal $V_{SD}$ measured at the input of the switchable driver varies by 50% of the full scale in the case of 4 segments, and around 30% of the full scale in the case of 7 segments. This signal variation is large enough to be detected by the delay controller 106. In the case of the 7 segments, the best conditions for re-calibration are illustrated in FIG. 4 for one of the segments.

Figure 4:
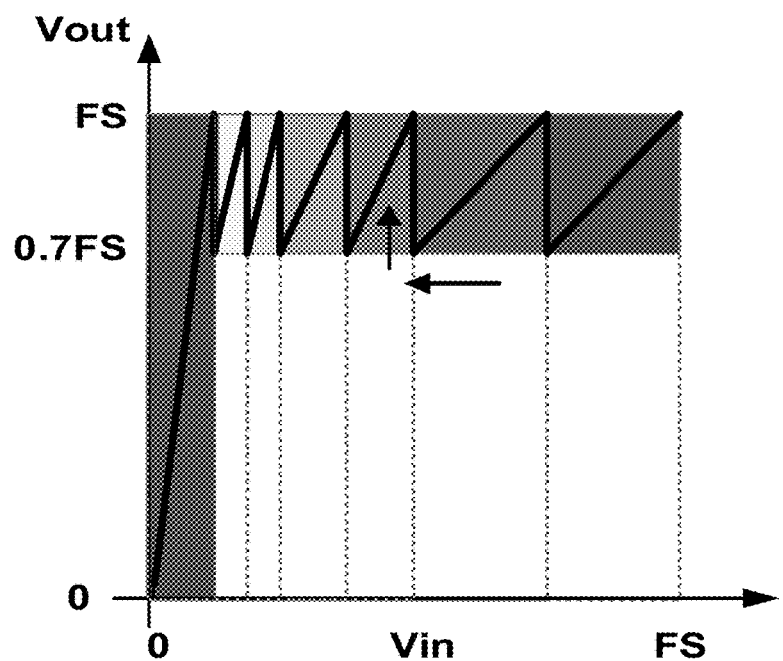
FIG. 4 shows a 7-Level baseband signal triggers Enable through high-to-low transition.

FIG. 4 shows a 7-Level baseband signal triggers Enable through high-to-low transition. The grey dotted lines in FIG. 4 indicate the segment boundaries. The arrows indicate the change direction of the signal at the input $V_{in}$ (X-axis) and the change in direction of the output voltage $V_{out}$ (Y-axis) after signal pre-warping. More transitions happen for the least-significant-bits (LSBs) than for the most-significant-bits (MSBs) due to the nature of the typical orthogonal frequency-division multiplexing (OFDM) signals usually with 6 to 12 dB peak-to-average ratio. Therefore, signal transitions in multiple segments can be used for the calibration algorithm. Through the Enable flag signal shown in FIG. 1, a smart algorithm for deciding when the calibration process is enabled can be implemented.

Assuming the conditions for the timing mismatch calibration are identified in the digital signal processor (DSP 101), and assuming the enable signal indicates when the engine should measure the timing error, the following exemplary implementation of the timing calibration scheme is proposed. One skilled in the art would appreciate that this example is for illustration only and that other modifications and variations are possible without departing from the scope of the invention.

Figure 5:
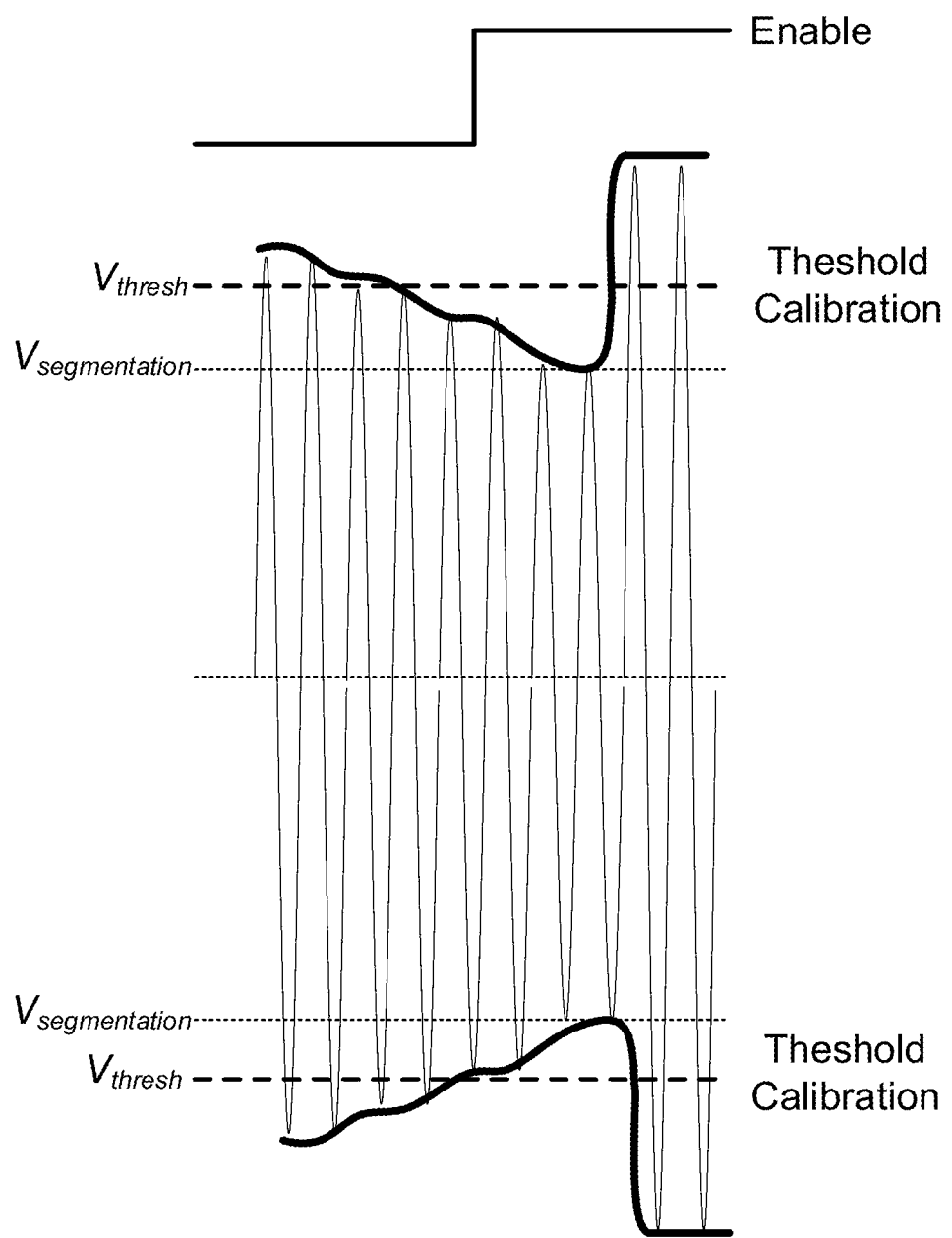
FIG. 5 shows an example of a signal at the switchable driver, indicating the jump and a threshold voltage needed for jump detection.

FIG. 5 shows an example of a signal at the switchable driver, indicating the jump and a threshold voltage needed for jump detection, i.e., a moment suitable for starting the calibration. Every transition between segments can be used for timing calibration. Because the amplifier's gain is well-controlled, a proper and robust reference voltage and a very fast threshold level detector are required.

For the case in which the magnitude of the input signal (before the segmentation process) decreases and moves from one segment to the next, the digital conditioning signal suddenly increases and reaches the full-scale value at that moment. The Enable signal is generated and alerts the calibration scheme that a signal transition suitable for timing mismatch calibration is imminent. At the moment when the incoming signal crosses the segmentation threshold, the signal conditioning increases the digital gain to the next level, and the signal jump is then perceptible at input of the switchable drivers. At this moment, the jump is detected, and the signal delay is measured by comparing the moment of the jump at the $V_{SD}$ node and the moment when the Enable signal rises. The purpose of the Enable signal is to serve as a flag for calibration as well as the reference signal for measuring the timing offset. A fast threshold detector may be used to detect the jump at $V_{SD}$.

Figure 6:
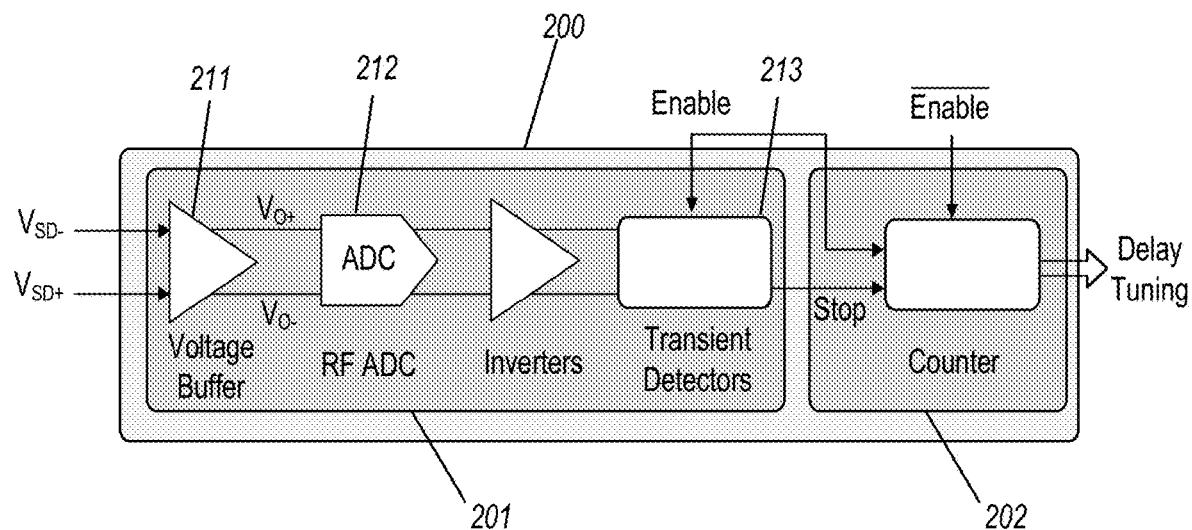
FIG. 6 shows details of an exemplary delay controller in accordance with one embodiment of the invention.

As noted above with reference to FIG. 1, a delay controller (shown as 106 in FIG. 1) is used to control the delays. FIG. 6 shows details of an example of a delay controller 200, which includes a waveform detector 201 and a delay counter 202. The waveform detector 201 continuously monitors variations of $V_{SD}$ (here in a differential form $V_{SD+}$ and $V_{SD-}$). The delay counter 202 counts the delay after the Enable signal. After the transient, detectors get reset by the Enable signal. When waveform detector 201 detects the desired $V_{SD}$ jump, it issues a Stop signal to stop the delay counter 202 from counting. In this way, the desired delay of $S_{BB\_PD}$ to $V_{SD}$ is measured and recorder by the delay counter 202. The delay counter 202 generates relevant delay tuning signals to the DSP 101.

In accordance with embodiments of the invention, the delay counter 202 may operate as follows:

If the enable signal is '0', the output of the transient detectors 213 (stop signal) is unchanged as '0'. That indicates the signal is not crossing different digital gain regions, and the calibration circuits is dormant. This action keeps the programmable delay invariant. When the Enable signal is activated, the amplitude of the input signal is compared with the threshold voltages in the RF ADC 212. If the differential signal is higher than the differential reference voltages, a close to rail-to-rail digital swing could be generated at input transient detectors. One or multiple outputs of the transient detectors 213 change to a '1'.

Figure 7:
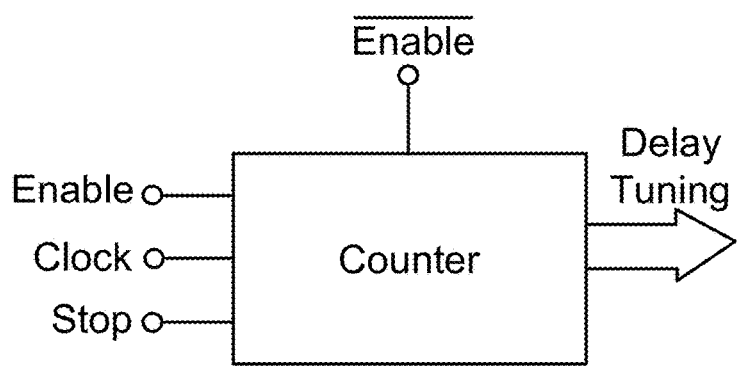
FIG. 7 shows an example of delay counter implementation in accordance with one embodiment of the invention.

Once the output of transient detectors 213 (stop signal) changes to a '1', it stays at that level until the Enable signal goes low and tells the DSP to stop counting. A counter inside the DSP 101 is started by the Enable signal and it stops when the outputs of the transient detector 213 are activated. Before the comparison starts, the counter is reset with the Enable signal itself. The circuit shown in FIG. 7 displays an exemplary implementation of this scheme, which is fundamentally a time to digital converter (TDC). The counter counts the number of clock cycles within the time period from Enable to Stop. This value (delay time) is reported to the DSP 101 to generate a proper compensation delay through the programmable delay element 116 shown in FIG. 1.

Notice in this system that the resolution of the counter-based system is dictated by the period of the clock. More sophisticated time-to-digital converter schemes can be used to improve this resolution.

Figure 8:
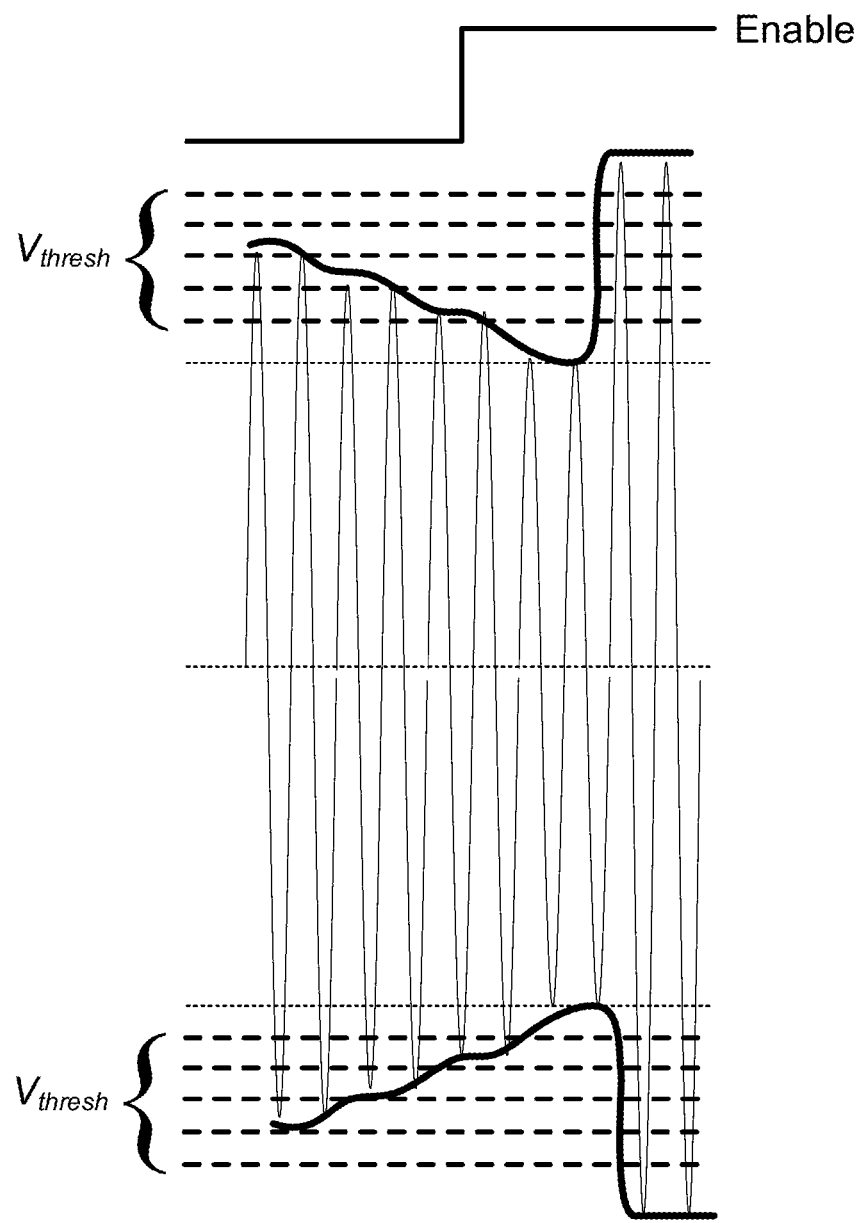
FIG. 8 shows signal at the switchable driver, indicating the jump and multiple threshold voltages in accordance with one embodiment of the invention.

The robustness of the calibration scheme increases if instead of employing a single comparator, multiple (e.g., a set of 4 or 5) comparators with different threshold voltages are used as illustrated in FIG. 8. The range of coverage increases in this way and the circuit behaves more likely a flash ADC.

The use of multiple comparators facilitates a more precise determination of when to update the programmable delay element 116. More comparators with different levels allow better transitions. However, the loading due to multiple comparators may limit the speed of the comparators.

Figure 9:
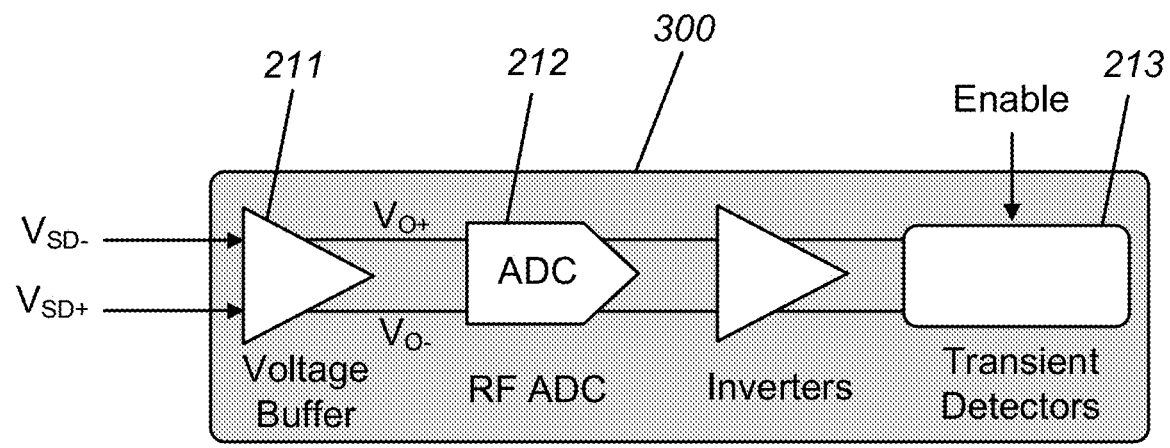
FIG. 9 shows details of a waveform detector in accordance with one embodiment of the invention.

FIG. 9 shows details of the parts in a waveform detector (shown as 201 in FIG. 6). As shown in FIG. 9, the waveform detection block 300 mainly consists of four parts, a voltage buffer 211, an RF ADC 212, an inverter, and a transient detector 213.

Figure 10:
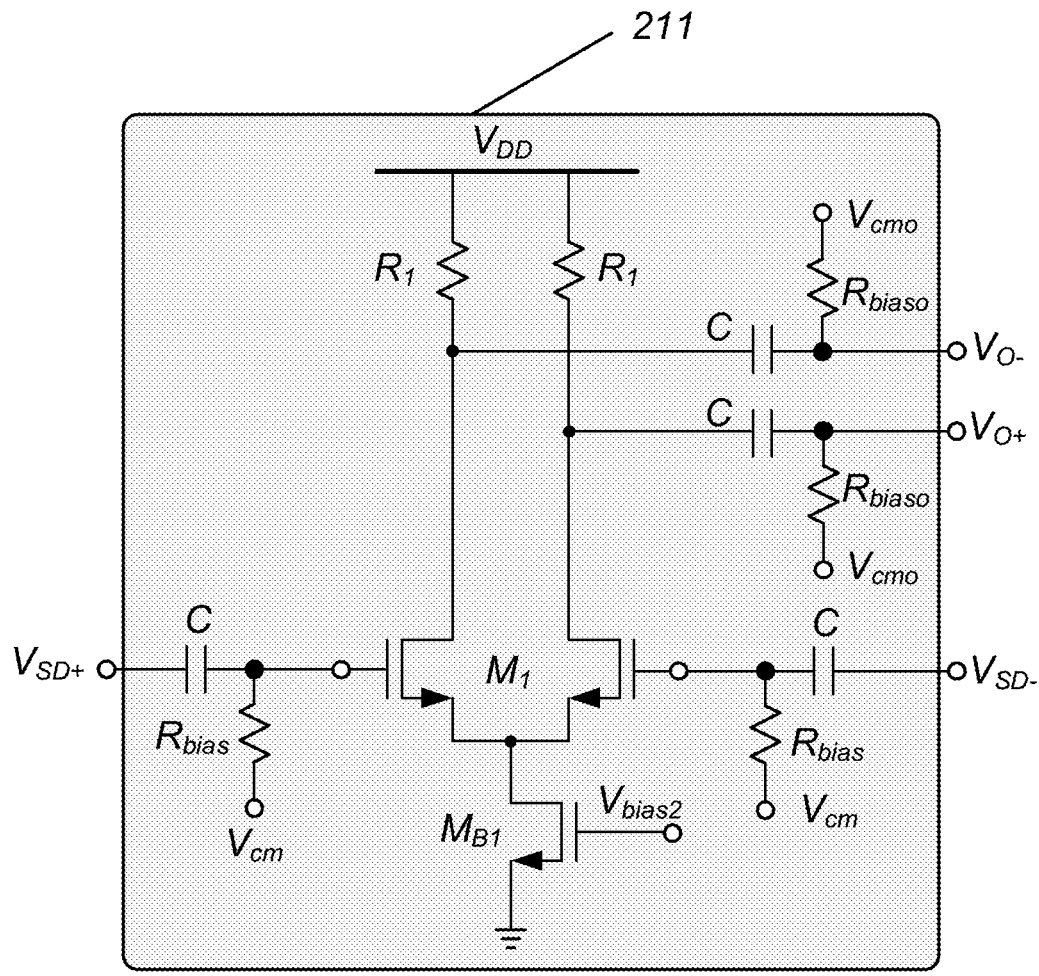
FIG. 10 shows a schematic illustrating a voltage buffer in accordance with one embodiment of the invention.

The voltage buffer 211 may be realized through an AC-coupled single stage amplifier. One example of a voltage buffer is illustrated in FIG. 10. The gain (gm*R1) of the voltage buffer 211, for example, may be calibrated to be close to 2. The gm is the transconductance of transistors M1.

The RF ADC 212 compares the amplified signal of $V_{SD}$ as $V_{O+}$ and $V_{O-}$ with reference voltages. When the $V_{O+}$ and $V_{O-}$ keep moving below or above the reference voltages, the RF ADC 212 is fast enough to amplify the signal and generate a clock-like signal toggling between '0' and '1' at its output.

Figure 11:
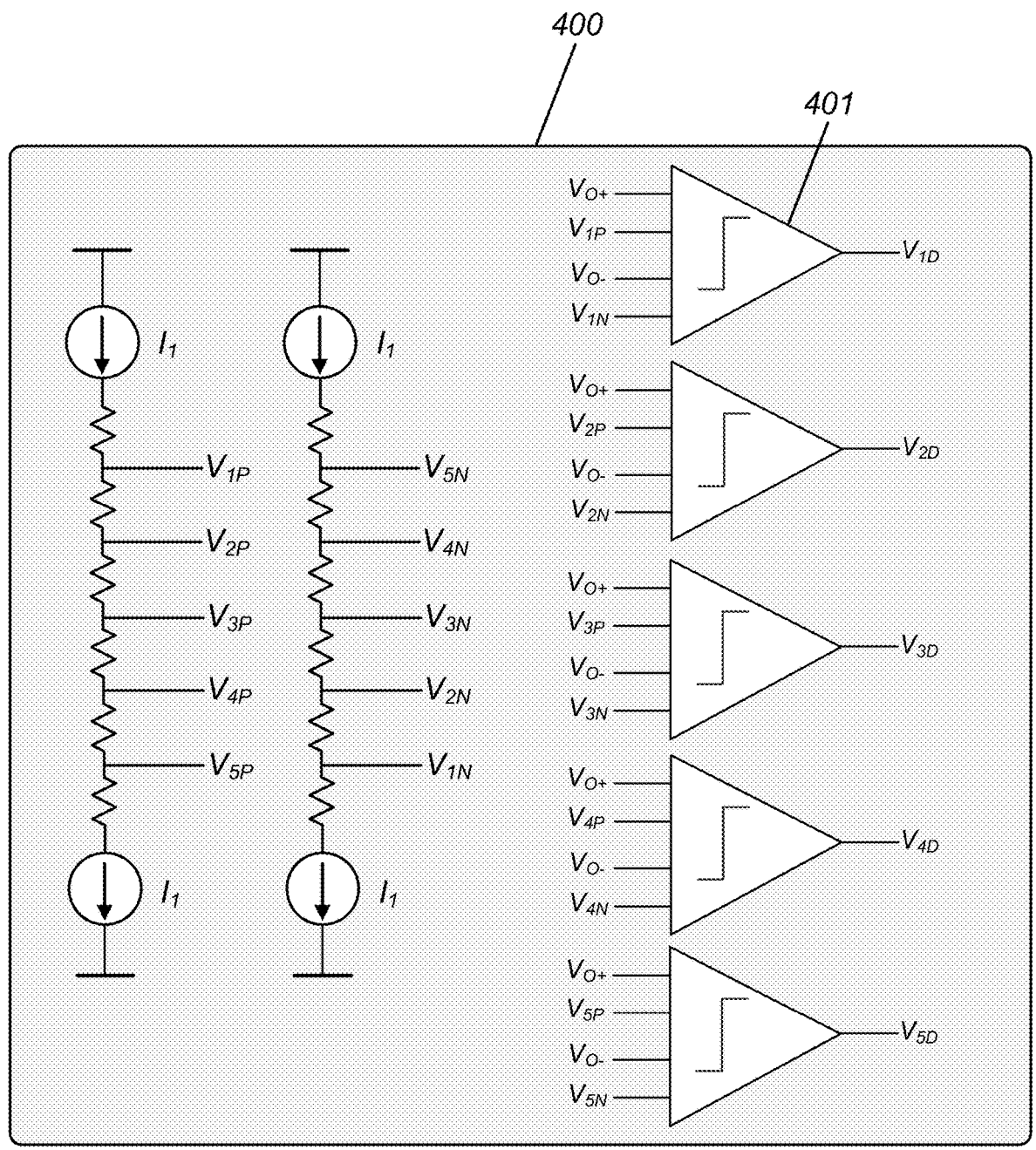
FIG. 11 shows a schematic illustrating an RF ADC in accordance with one embodiment of the invention.

Any suitable implementations for RF ADC (e.g., flash ADC) known in the art may be used with embodiments of the invention. FIG. 11 shows one exemplary implementation of an RF ADC 400, using a flash ADC that employs a voltage ladder and a set of fast comparators 401. As shown in FIG. 11, positive and negative reference voltages, such as $V_{IP}$ and $V_{IN}$, are generated from resistive voltage division networks, and the fast comparators 401 compare the differential input $V_{O+}$ and $V_{O-}$ with two reference voltages $V_P$ and $V_N$, respectively. Here, the signals are processed continuously, and the comparators are able to toggle between GND and VDD for the case when inputs $V_{O+}$ and $V_{O-}$ are crossing the reference voltage continuously.

Figure 12:
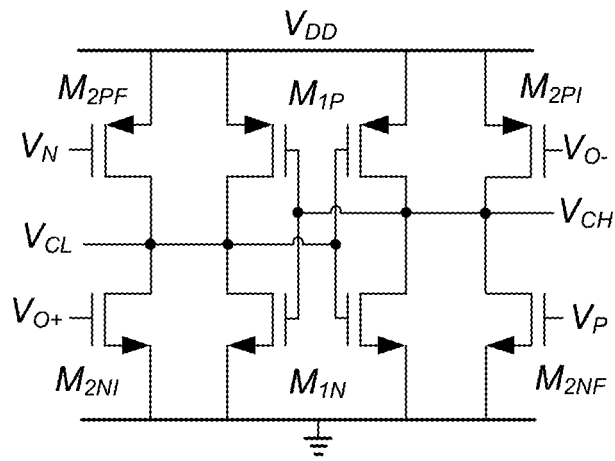
FIG. 12 shows a schematic illustrating a fast comparator in accordance with one embodiment of the invention.

A fast comparator 401 in FIG. 11 may be implemented with any suitable scheme, such as that shown in FIG. 12. In this example, $V_{O+}$ and $V_{O-}$ are compared with reference voltages $V_P$ and $V_N$. The current reuse topology in FIG. 12, with NMOS and PMOS used simultaneously, benefits the targeted fast toggling with two reasons: (1) In comparison with conventional NMOS only input, NMOS and PMOS input increases driving strength; and (2) The $M_{2NI}$ and $M_{2NF}$ are loaded by $M_{2PF}$ and $M_{2PI}$ instead of $M_{IP}$, which generates a symmetric structure of NMOS and PMOS transistors with similar transconductances and the targeted fast toggling is more symmetrical for output above or below half of $V_{DD}$. This comparator is sufficiently fast to detect fast signals (e.g., up to >6 GHz). $V_{CL}$ and $V_{CH}$ are processed and combined by digital logic as the outputs of comparator 401. This comparator is especially suitable for low power supply applications.

Figure 13:
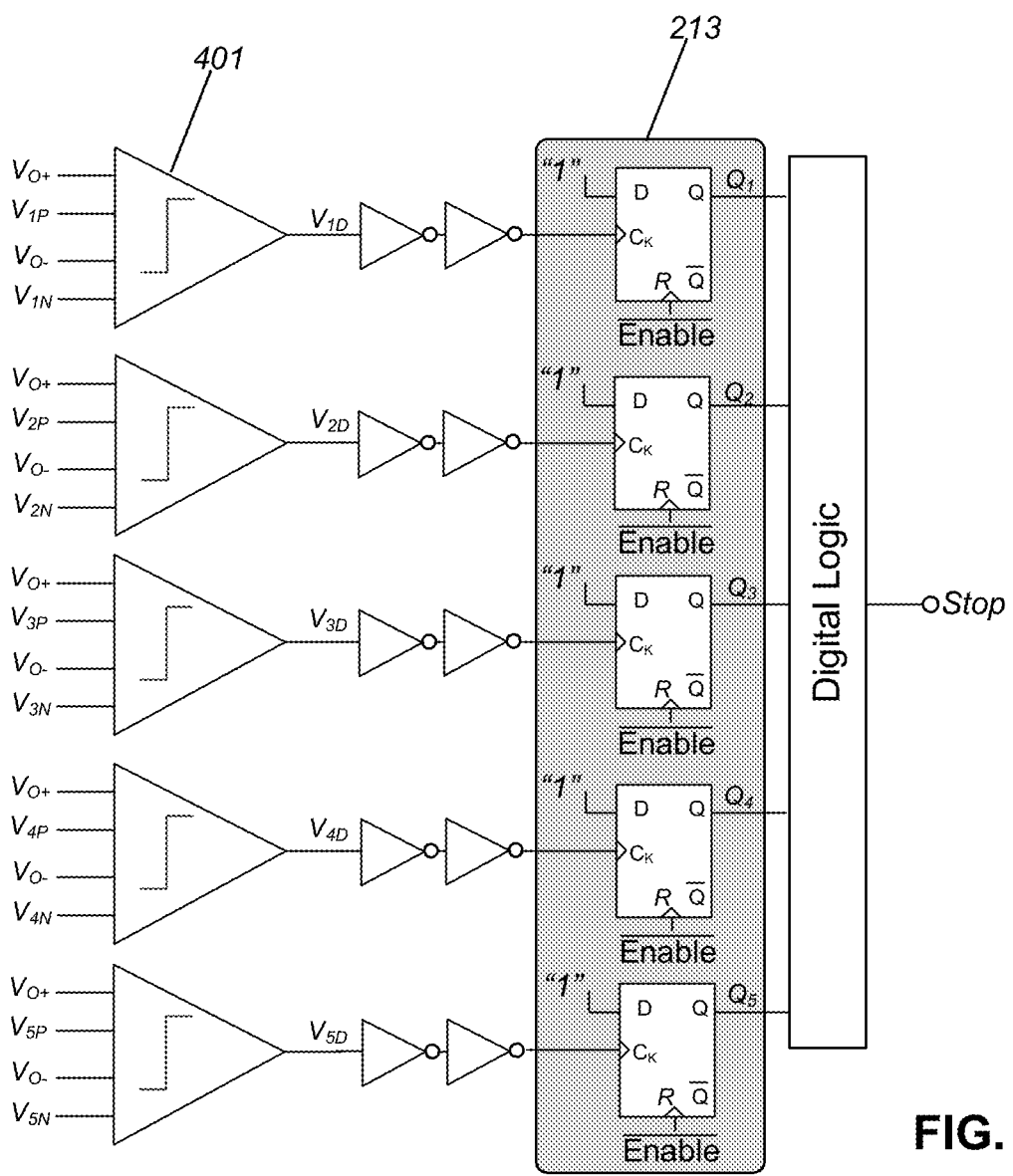
FIG. 13 shows a schematic illustrating a D Flip-flop based transient detector in accordance with one embodiment of the invention.

Any suitable transient detector circuits known in the art may be used with embodiments of the invention. An exemplary implementation of D Flip-Flop base transient detector 213 is shown in FIG. 13. A "0" Enable signal will reset the output to be '0'. When the enable signal is '1', the flip-flops output will change and keep at 1 if a clock signal can be applied. The clock signal comes from the output of the fast comparator 401, which indicates whether the signal is above, equal to (crossing), or below the threshold voltages.

Figure 14:
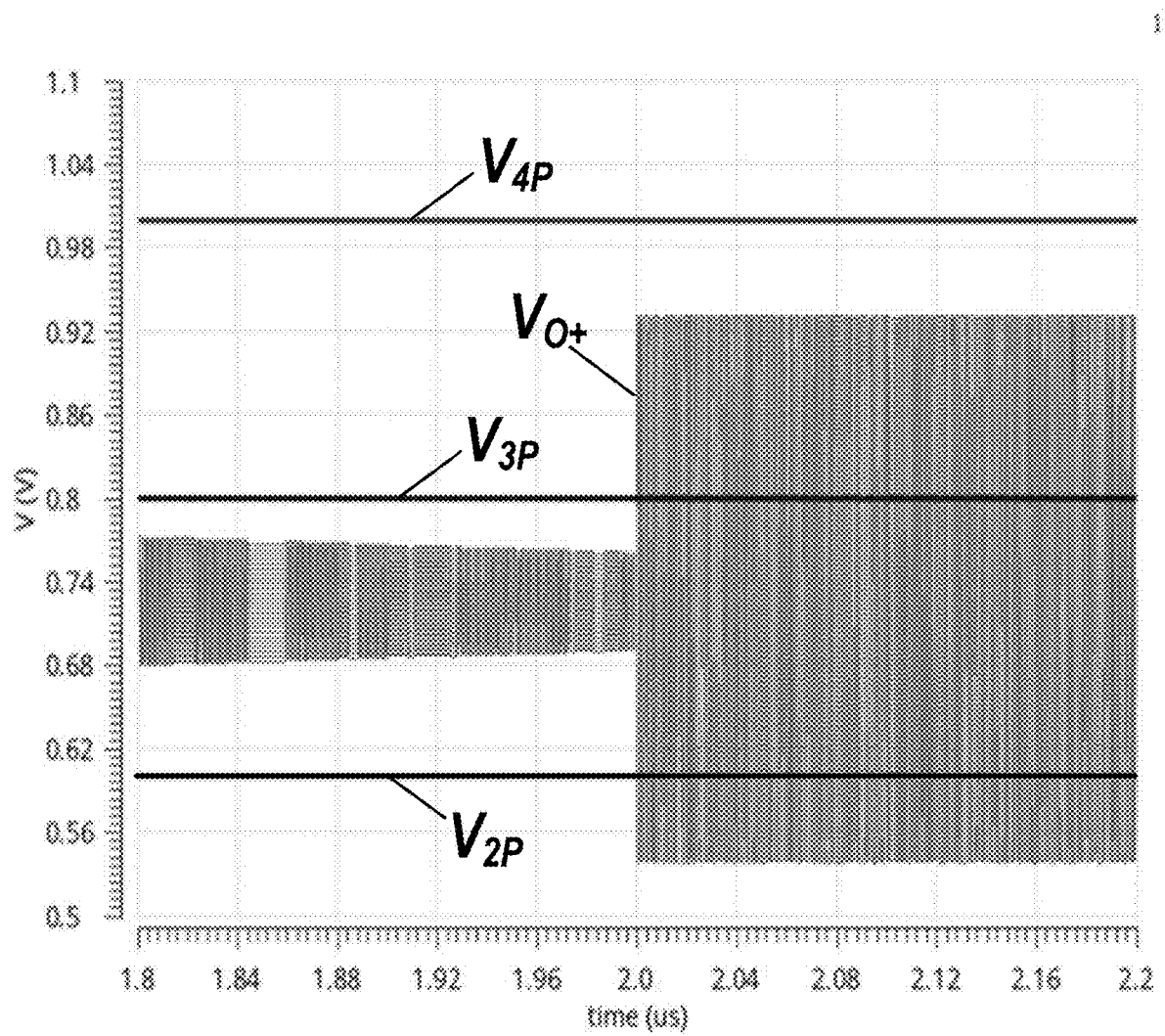
FIG. 14 shows simulation results of input signal present at the input of the switchable drivers, illustrating at 2 μs, the input signal transitions and generates a jump. The signal has been amplified by an extra amplifier to increase the system sensitivity. The horizontal $V_{2P}$, $V_{3P}$, and $V_{4P}$ lines show three threshold voltages used in the flash ADC for the signal jump detection.
Figure 15:
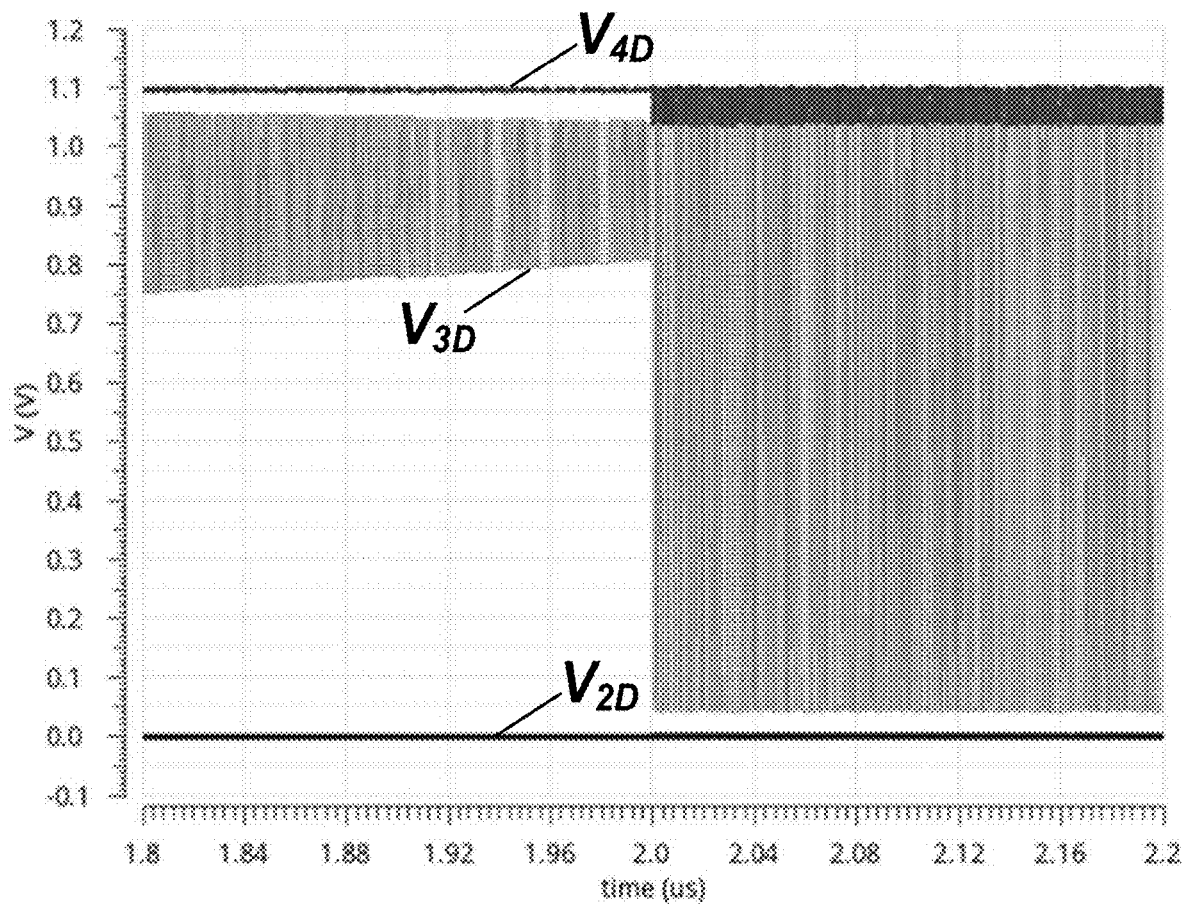
FIG. 15 shows an example, in which the comparator positioned in the middle level ($V_{3D}$) is the only one that toggles while the other two comparators ($V_{2D}$ and $V_{4D}$) stay in their original levels.
Figure 16:
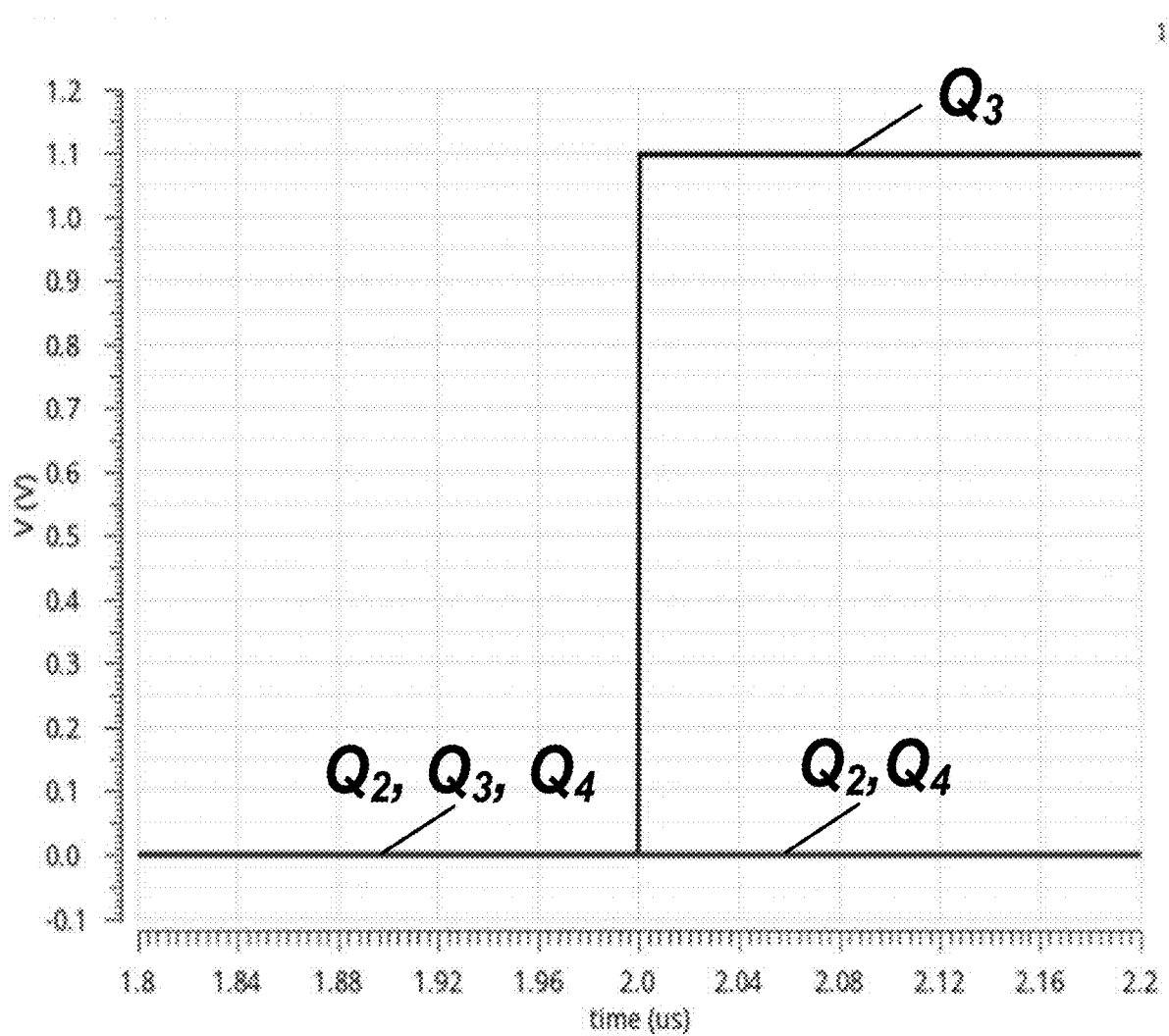
FIG. 16 shows an example, in which the toggling is detected by the D-flip-flops, and then the control signal (Q3 curve) is generated and may be used to stop the comparator.

Simulations of this timing mismatch calibration scheme have been performed to validate the scheme. The results are shown in FIGS. 14-16. The names of the signals correspond to the wire names in FIG. 13.

In FIG. 14, the curve ($V_{O+}$) shows the input signal present at the input of the switchable drivers. At 2 μs, the input signal transitions and generates a jump. The signal has been amplified by an extra amplifier to increase the system sensitivity. The horizontal $V_{2P}$, $V_{3P}$, and $V_{4P}$ lines show three threshold voltages used in the flash ADC for the signal jump detection. The system has 5 levels in total, with small spacing as shown in FIG. 8.

In FIG. 15, the comparator positioned in the middle level ($V_{3D}$) is the only one that toggles while the other two comparators ($V_{2D}$ and $V_{4D}$) stay in their original levels.

In FIG. 16, the toggling is detected by the D-flip-flops in 213, and then the control signal (Q3 curve) is generated and used to stop the comparator.

Embodiments of the invention have been described with reference to a limited number of examples. One skilled in the art would appreciate that these examples are for illustration only and are not meant to limit the scope of the invention. Instead, the scope of the invention should only be limited by the attached claims.

REFERENCES CITED

[1] Qian, H., Liu, Q., Silva-Martinez, J. and Hoyos, S., 2016. A 35 dBm output power and 38 dB linear gain PA with 44.9% peak PAE at 1.9 GHz in 40 nm CMOS. IEEE Journal of Solid-State Circuits, 51(3), pp. 587-597.
[2] S. C. Cripps, RF Power Amplifiers for Wireless Communication. Norwood, Mass.: Artech House, 1999.
[3] Sigmon, Bernard Eugene, and Ronald Gene Myers. "High efficiency power amplifier circuit with wide dynamic backoff range." U.S. Pat. No. 6,157,253. 5 Dec. 2000.
[4] Budnik, Brian Joseph. "Method and apparatus for operating a radio-frequency power amplifier as a variable-class linear amplifier." U.S. Pat. No. 6,043,707. 28 Mar. 2000.
[5] Kurby, Christopher Neil, Joe Martin Smith, and Gary Parker English. "Method and apparatus for efficient signal amplification." U.S. Pat. No. 6,252,455. 26 Jun. 2001.
[6] Grondahl, Christopher David. "Method and apparatus for reducing distortion in a high efficiency power amplifier." U.S. Pat. No. 5,936,464. 10 Aug. 1999.
[7] Drogi, Serge Francois. "Envelope tracking power amplifier system with delay calibration." U.S. Pat. No. 8,718,579. 6 May 2014.
[8] Pilgram, Berndt. "Envelope tracking path delay fine tuning and calibration." U.S. Pat. No. 9,692,366. 27 Jun. 2017.
[9] Loh, Lup Meng, et al. "Apparatus and method for enveloping tracking calibration." U.S. Pat. No. 8,873,677. 28 Oct. 2014.
[10] Khlat, Nadim, and Karl Francis Horlander. "Group delay calibration method for power amplifier envelope tracking." U.S. Pat. No. 8,942,313. 27 Jan. 2015.
[11] Shute, Nicholas. "Delay adjustment." U.S. patent application Ser. No. 14/892,501, March 2016.

What is claimed is:

1. An apparatus for calibrating timing mismatch in a power amplifier, comprising:
    a segmented power amplifier (PA);
    a digital signal processor (DSP); and
    a delay controller connected to the digital signal processor (DSP) and configured to be driven by the digital signal processor (DSP) through an Enable signal,
    wherein the digital signal processor (DSP) is configured to measure and calibrate a delay between a signal path and a control path,
    wherein the digital signal processor (DSP) comprises:
        a signal processing encoder configured to process an input signal to produce a baseband signal ($S_{BB}$) and a magnitude signal ($S_{mag}$);
        a PA magnitude control connected to the signal processing encoder, wherein the PA magnitude control is configured to use the magnitude signal ($S_{mag}$) to generate a PA reference signal ($S_{PA\_Ref}$), and wherein the PA magnitude control is configured to generate the Enable signal to the delay controller when variation in magnitudes of the input signal exceeds a threshold voltage;
        a signal conditioning circuit connected to the signal processing encoder and the PA magnitude control, wherein the signal conditioning circuit is configured to condition the baseband signal ($S_{BB}$), based on the PA reference signal ($S_{PA\_Ref}$), to produce a pre-distorted baseband signal ($S_{BB\_PD}$);
        a programmable delay element connected to the PA magnitude control; and
        a delay tuning circuit connected to the programmable delay element for controlling the programmable delay element to generate a PA retiming signal ($S_{PA\_Retimed}$).

2. The apparatus for calibrating timing mismatch in a power amplifier according to claim 1, wherein the delay controller comprises a waveform detector and a delay counter.

3. The apparatus for calibrating timing mismatch in a power amplifier according to claim 2, wherein the waveform detector comprises a voltage buffer, an RF ADC, an inverter, and a transient detector.

4. The apparatus for calibrating timing mismatch in a power amplifier according to claim 3, wherein the waveform detector comprises a voltage buffer, a radiofrequency analog-to-digital converter (RF ADC), an inverter, and a transient detector.

5. The apparatus for calibrating timing mismatch in a power amplifier according to claim 4, wherein the RF ADC comprises a flash ADC that comprises a voltage ladder and a set of comparators.

6. The apparatus for calibrating timing mismatch in a power amplifier according to claim 4, wherein the transient detector is a D Flip-Flop base transient detector.

7. A method for calibrating timing mismatch in a power amplifier using the apparatus according to claim 1, comprising:
    processing, using the signal processing encoder, the input signal to produce the baseband signal ($S_{BB}$) and the magnitude signal ($S_{mag}$);
    producing the PA reference signal ($S_{PA\_Ref}$) by the PA magnitude control;
    choosing the threshold voltage for the variation in the magnitudes of the input signal;
    generating the Enable signal to the delay controller when the variation in the magnitudes of the input signal exceeds the threshold voltage;
    generating a delay tuning signal from the delay controller to the programmable delay element; and
    generating the PA retiming signal ($S_{PA\_Retimed}$) by the programmable delay element to minimize time mismatch between the signal path and the control path.

* * * * *